United States Patent
Mittelholzer et al.

(10) Patent No.: US 9,619,328 B2
(45) Date of Patent: *Apr. 11, 2017

(54) READ-DETECTION IN MULTI-LEVEL CELL MEMORY

(71) Applicant: International Business Machines Corporation, Armonk, NY (US)

(72) Inventors: Thomas Mittelholzer, Zurich (CH); Nikolaos Papandreou, Thalwil (CH); Charalampos Pozidis, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/058,763

(22) Filed: Mar. 2, 2016

(65) Prior Publication Data

US 2016/0179619 A1 Jun. 23, 2016

Related U.S. Application Data

(63) Continuation of application No. 14/251,734, filed on Apr. 14, 2014, now Pat. No. 9,305,639.

(30) Foreign Application Priority Data

Apr. 30, 2013 (GB) .................................. 1307788.8

(51) Int. Cl.
*G06F 11/07* (2006.01)
*G06F 11/10* (2006.01)
(Continued)

(52) U.S. Cl.
CPC .......... *G06F 11/1076* (2013.01); *G06F 3/064* (2013.01); *G06F 3/0619* (2013.01);
(Continued)

(58) Field of Classification Search
CPC ..................................................... G11C 29/56
(Continued)

(56) References Cited

U.S. PATENT DOCUMENTS

| 8,225,180 B2 | 7/2012 | Jiang et al. |
| 8,780,620 B2 | 7/2014 | Jiang et al. |

(Continued)

FOREIGN PATENT DOCUMENTS

| EP | 1681770 A1 | 7/2006 |
| WO | WO 00/02008 A1 | 1/2000 |

(Continued)

OTHER PUBLICATIONS

List of IBM Patents or Patent Applications treated as related.

*Primary Examiner* — Fritz Alphonse
(74) *Attorney, Agent, or Firm* — Scully, Scott, Murphy & Presser, P.C.; David Quinn, Esq.

(57) ABSTRACT

A data storage device for storing N-symbol codewords. The device implementing a method including: reading q-level memory cells to obtain a read signal having N signal components; detecting the memory cell level corresponding to each component using a first correspondence criterion dependent on reference signal levels; identifying unreliable components; detecting, for each unreliable component, the next-most-closely corresponding memory cell level according to the first correspondence criterion; defining a set of ordered codeword vectors having N symbols corresponding to respective components of the read signal ordered according to a signal level, wherein the symbol values in each ordered codeword vector correspond to one combination of detected memory cell levels; defining, for each read signal, candidate initial vectors having intersected the ordered codeword vectors and plurality of initial vectors; and detecting, if the candidate initial vectors contains a vector, the code- (Continued)

word corresponding to that read signal that depends on the candidate initial vectors.

17 Claims, 6 Drawing Sheets

(51) Int. Cl.
   *G11C 11/56* (2006.01)
   *G11C 13/00* (2006.01)
   *G06F 3/06* (2006.01)

(52) U.S. Cl.
   CPC ........ *G06F 3/0679* (2013.01); *G11C 11/5642* (2013.01); *G11C 11/5678* (2013.01); *G11C 13/0004* (2013.01); *G11C 13/004* (2013.01); *G11C 2211/5648* (2013.01)

(58) Field of Classification Search
   USPC .......................................... 714/719, 805, 806
   See application file for complete search history.

(56) References Cited

U.S. PATENT DOCUMENTS

| | | |
|---|---|---|
| 2007/0208905 A1 | 9/2007 | Litsyn et al. |
| 2012/0075930 A1 | 3/2012 | Patapoutian et al. |
| 2012/0213001 A1* | 8/2012 | Yang .................. G06F 11/1048 365/185.2 |
| 2013/0094289 A1* | 4/2013 | Sridharan ........... G11C 11/5628 365/185.03 |
| 2013/0227380 A1 | 8/2013 | Mittelholzer |

FOREIGN PATENT DOCUMENTS

| | | |
|---|---|---|
| WO | WO 2008/075351 A2 | 6/2008 |
| WO | WO 2013/046066 A1 | 4/2013 |
| WO | WO 2013/093669 A1 | 6/2013 |

* cited by examiner

| | $z_{b,n}>h_0$ | $z_{b,n}>h_1$ | $z_{b,n}>h_2$ | |
|---|---|---|---|---|
| $z_{b,n}\leq h_0$ | 0 | 0 | 0 | $l_0$ |
| $h_0<z_{b,n}\leq h_1$ | 1 | 0 | 0 | $l_1$ |
| $h_1<z_{b,n}\leq h_2$ | 1 | 1 | 0 | $l_2$ |
| $h_2<z_{b,n}$ | 1 | 1 | 1 | $l_3$ |

| Method A | ADD | MUL | DIV | LOG | SQRT | COMP |
|---|---|---|---|---|---|---|
| vector MD detection | $(q-1)P + NPB$ | $q(P+1)+NPB$ | — | — | — | $(P-1)B$ |
| level means and variance estimation | $2NB-4$ | $NB+8$ | $2q$ | — | — | — |
| vector ML detection | $2NPB$ | $(N-1)P+NPB$ | $NPB$ | $P$ | — | $(P-1)B$ |
| total | 66043 | 44723 | 21768 | 85 | — | 5376 |

| Method B-new | ADD | MUL | DIV | LOG | SQRT | COMP |
|---|---|---|---|---|---|---|
| scalar MD detection using MD threshold | $q-1$ | — | — | — | — | $(q-1)NB$ |
| level means and variance estimation | $2NB-4$ | $NB+8$ | $2q$ | — | — | — |
| scalar ML detection with reliability information | $2(q-1)+2M+6$ | $2(q-1)+4$ | $(q-1)+4$ | — | $q$ | $(q-1)NB+3M-2$ |
| total | 539 | 274 | 15 | — | 4 | 1558 |

| Savings | > 99% | > 99% | > 99% | — | — | > 71% |

Figure 6

READ-DETECTION IN MULTI-LEVEL CELL MEMORY

CROSS-REFERENCE TO RELATED APPLICATION

This application is a continuation application of parent application U.S. patent application Ser. No. 14/251,734 filed Apr. 14, 2014 which parent application claims priority under 35 U.S.C. §119 from Patent Application No. GB1307788.8 filed Apr. 30, 2013, the entire contents of which are incorporated herein by reference.

BACKGROUND OF THE INVENTION

1. Field of the Invention

The present invention relates generally to read-detection in multi-level cell (MLC) memory, and more particularly, to methods and an apparatus for detecting codewords stored in multi-level memory cells on readout of MLC memory.

2. Description of the Related Art

In MLC memory, the fundamental storage unit (the "cell") can be set to q>2 different states, or "levels", permitting storage of more than one bit per memory cell. Detection of stored data relies on identifying the different cell levels on readback. In solid-state memory such as flash memory and phase change memory (PCM), for example, the different cell levels exhibit different electrical resistance characteristics which can be detected via current or voltage measurements on the cells. When writing information in MLC memory, each cell can be used to store a $q^{ary}$ symbol with each of the q possible symbol values being represented by a different cell level. On readout of multi-level cells, the read signal level is compared with a set of reference signal levels indicative of the q cell levels in order to determine which level each cell is set to and thus detect the stored symbol value.

A problem in MLC memory is that the physical quantity measured during cell readout is subject to variability, e.g. due to drift in measured values with time or cell usage. For example, the electrical resistance of PCM cells drifts upwards with time in a stochastic manner. This drift can be data-dependent, i.e. can vary for different cell levels. As another example, the physical quantity measured in flash memory cells is the transistor's threshold voltage and this drifts upwards as a function of the number of write/erase cycles the cell is subjected to. Cell readout can also be hampered by noise, causing further variation in read signal levels. For any given stored symbol value and hence cell level, therefore, the actual read signal level obtained on cell-readout is variable.

Level variability is a serious problem for multi-level storage in that it severely compromises reliability. The readback values of neighbouring levels can interfere with one another, e.g. due to upward drift of the lower level towards the upper level over time, causing detection errors. The closer the initial spacing between levels, the more susceptible they are to this problem. Hence, packing higher numbers of levels per memory cell becomes more difficult due to the increased likelihood of error during detection. On the other hand, packing more bits per cell is a crucial requirement for all memory technologies, being the best known way of reducing manufacturing cost per bit. For efficient performance of MLC devices, therefore, the codeword detection system must accommodate the variability in read signal level distributions.

A read detection system which addresses level variability issues is described in copending International Patent Application no. PCT/IB2012/053237, filed Jun. 27, 2012 (WO 2013/046066 A1). This discloses a drift-resistant technique for read-detection of permutation-based codes in MLC memory. The codes in question are length-N, $q^{ary}$-symbol codes, whereby each codeword has N symbols and each symbol can take one of q symbol values. Each symbol is recorded in a respective q-level cell by setting the cell to a level dependent on the $q^{ary}$ symbol value. The system first derives estimates for the q reference signal levels for cell levels, then uses these reference levels for codeword detection. The system exploits the property of permutation-based codes that all codewords are permutations of a known set of N-symbol vectors, referred to herein as "initial vectors", whose symbols are ordered according to symbol value. Memory cells are read in batches to obtain read signals corresponding to a group of codewords. Each read signal has N signal components corresponding to respective symbols of a codeword, and these components are ordered according to signal level to obtain an ordered read signal for each codeword. Components of these ordered read signals are related to symbols of the known set of initial vectors via a process which involves averaging ordered read signals and relating the averaged signal components to symbol values using predefined probabilities of occurrence of different symbol values at different symbol positions as derived from the initial vectors. This reduces the problem of finding the q drifted reference signal levels to the problem of solving an over-determined system of N linear equations for the q unknown reference levels. Estimates are thus obtained for the reference signal levels for the q cell levels, and these reference signal levels are then used for detection of the current group of codewords. The subsequent detection process of PCT/IB2012/053237 involves a first detection stage wherein the initial vector which most-closely corresponds to a read signal is determined via a vector-based minimum-difference technique. This involves comparing the ordered read signal to each initial vector and selecting the "closest" vector according to some minimum difference criterion. Optionally, statistical data is then calculated for the distributions of read signal components corresponding to each cell level. This statistical data provides refined estimates for the reference signal levels, and is used in a second stage of the detection process. In this stage, the initial vector which most-closely corresponds to a read signal is again determined via a vector-based technique. The ordered read signal is again compared to each initial vector, with the closest vector being selected here according to a statistically-based criterion such as a MAP (maximum-a-posteriori) or ML (maximum-likelihood) criterion which exploits the aforementioned statistical data. The output codeword can be obtained from the initial vector identified for a read signal in the first or second detection stage by applying an inverse permutation to that initial vector. This inverse permutation is the inverse of the permutation of the read signal which ordered the components according to signal level to produce the ordered read signal for the codeword.

The detection system of PCT/IB2012/053237 is self-adaptive in that it uses the actual cells storing encoded user data to estimate the reference levels used for detection of those cells on readback, thereby accounting for level variability on a dynamic basis. Another such technique is described in copending UK Patent Application no. 1203496.3, filed 29 Feb. 2012 (US20130227380 A1). In this technique, the signal components of the entire group of read signals are ordered according to signal value. The resulting ordered component sequence is then partitioned to obtain a plurality of segments each corresponding to a different memory cell level. The size (i.e. number of components) of each of these segments is determined based on predetermined frequency data indicative of expected frequency of occurrence of the corresponding level in use of the code. The signal components in these segments can then be used to obtain the set of q current reference signal levels.

BRIEF SUMMARY OF THE INVENTION

A method for detecting N-symbol codewords, each N-symbol codeword being a permutation of one of a predefined plurality of N-symbol initial vectors having symbols that are ordered according to a symbol value, wherein the symbols of each codeword have one of q symbol values and are stored in respective q-level memory cells where q>2, the method including: reading the q-level memory cells to obtain a read signal having N signal components corresponding to respective symbols of the codeword; detecting the memory cell level which most-closely corresponds to each read signal component according to a first correspondence criterion dependent on reference signal levels for the q cell levels; identifying unreliable read signal components dependent on a reliability indicator for each read signal component, wherein the reliability indicator is dependent on proximity of the read signal component to the reference signal level for the most-closely corresponding memory cell level; additionally detecting, for each unreliable read signal component, the next-most-closely corresponding memory cell level according to the first correspondence criterion; defining, for each read signal, a set of ordered codeword vectors each having N symbols corresponding to respective components of the read signal ordered according to a signal level, wherein the symbol values in each ordered codeword vector correspond to one possible combination of the detected memory cell levels for the read signal components; defining, for each read signal, a set of candidate initial vectors having intersection of the set of ordered codeword vectors for that read signal and the predefined plurality of N-symbol initial vectors; and detecting, if the set of candidate initial vectors for the read signal contains at least one vector, the codeword corresponding to that read signal that is dependent on the set of candidate initial vectors.

An apparatus for detecting N-symbol codewords, each N-symbol codeword being a permutation of one of a predefined plurality of N-symbol initial vectors having symbols that are ordered according to a symbol value, wherein the symbols of each codeword have one of q symbol values and are stored in respective q-level memory cells where q>2, the apparatus including: a memory controller for reading the memory cells storing each codeword to obtain a read signal having N signal components corresponding to respective symbols of the codeword; and a codeword detector including control logic adapted to perform the steps of a method including: detecting the memory cell level which most-closely corresponds to each read signal component according to a first correspondence criterion dependent on reference signal levels for the q cell levels; identifying unreliable read signal components dependent on a reliability indicator for each read signal component, wherein the reliability indicator is dependent on proximity of the read signal component to the reference signal level for the most-closely corresponding memory cell level; additionally detecting, for each unreliable read signal component, the next-most-closely corresponding memory cell level according to the first correspondence criterion; defining, for each read signal, a set of ordered codeword vectors each having N symbols corresponding to respective components of the read signal ordered according to a signal level, wherein the symbol values in each ordered codeword vector correspond to one possible combination of the detected memory cell levels for the read signal components; defining, for each read signal, a set of candidate initial vectors having intersection of the set of ordered codeword vectors for that read signal and the predefined plurality of N-symbol initial vectors; and detecting, if the set of candidate initial vectors for the read signal contains at least one vector, the codeword corresponding to that read signal that is dependent on the set of candidate initial vectors.

A data storage device, including: a memory having q-level memory cells, where q>2; a write apparatus for writing in the memory N-symbol codewords, each N-symbol codeword being a permutation of one of a predefined plurality of N-symbol initial vectors having symbols that are ordered according to a symbol value, wherein the symbols of each codeword have one of q symbol values and are stored in respective memory cells; and an apparatus for detecting the codewords on reading of the memory.

BRIEF DESCRIPTION OF THE DRAWINGS

Preferred embodiments of the invention will now be described, by way of example, with reference to the accompanying drawings.

FIG. 6 compares complexity of the FIG. 2 detection process with a previously-proposed technique according to an embodiment of the present invention.

DETAILED DESCRIPTION OF THE PREFERRED EMBODIMENTS

Figure 1:
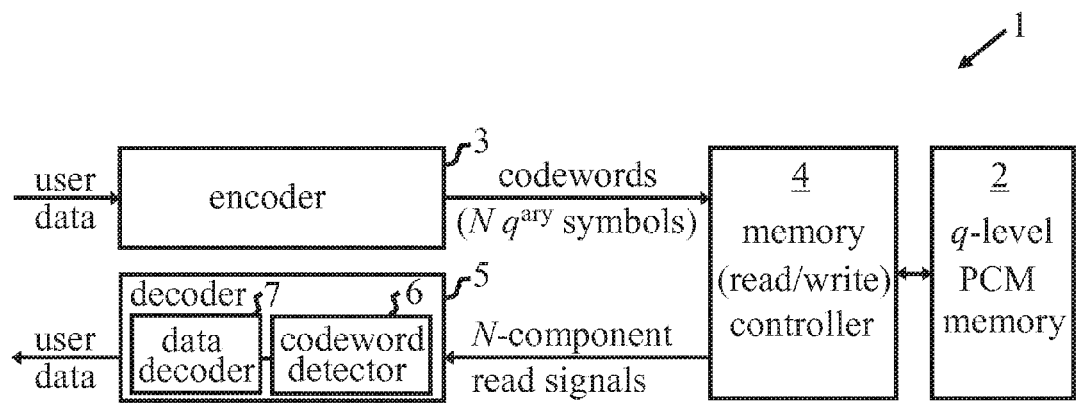
FIG. 1 is a schematic block diagram of a data storage device embodying the present invention.

According to an embodiment of a first aspect of the present invention a method is provided for detecting N-symbol codewords each being a permutation of one of a predefined plurality of N-symbol initial vectors whose symbols are ordered according to symbol value, wherein the symbols of each codeword, each of which has one of q symbol values, are stored in respective q-level memory cells where q>2. The method includes: reading the memory cells storing each codeword to obtain a read signal including N signal components corresponding to respective symbols of the codeword; detecting the memory cell level which most-closely corresponds to each read signal component according to a first correspondence criterion dependent on reference signal levels for the q cell levels; identifying unreliable read signal components in dependence on a reliability indicator for each component, the reliability indicator being dependent on proximity of the component to the reference signal level for the most-closely corresponding memory cell level; for each unreliable read signal component, additionally detecting the next-most-closely corresponding memory cell level according to the first correspondence criterion; for each read signal, defining a set of ordered codeword vectors each having N symbols corresponding to respective components of the read signal ordered according to signal level, wherein the symbol values in each ordered codeword vector correspond to one possible combination of the detected memory cell levels for the read signal components; for each read signal, defining a set of candidate initial vectors including the intersection of the set of ordered codeword vectors for that read signal and said predefined plurality of initial vectors; and if the set of candidate initial vectors for a read signal contains at least one vector, detecting the codeword corresponding to that read signal in dependence on the set of candidate initial vectors.

Read-detection methods embodying the present invention provide for detection of N-symbol codewords stored in q-level memory cells where the overall coding scheme is based on a union of permutation codes with a known set of N-symbol initial vectors. The detection system uses predetermined reference signal levels for the q memory cell levels.

The detection system uses a simple component-based detection technique in which the memory cell level which most-closely corresponds to each read signal component is determined on a component-by-component basis. In addition, reliability of individual read signal components is assessed using a reliability indicator. This depends on the proximity of a component to the reference signal level for its most-closely corresponding cell level. For read signal components deemed unreliable, component-based detection is used to detect the next-most-closely corresponding cell level for each component.

The results of these component-based detection steps are used to select, from the entire set of initial vectors for the code, a set of candidate initial vectors for each read signal. Detection of codewords corresponding to read signals can then be based on these sets of candidate initial vectors. In this way, the number of initial vectors that need to be considered in the detection process can be significantly reduced in embodiments of the invention. In addition, the component-based detection is less complex than the vector-based detection of the schemes described above. As a result, embodiments of the invention offer codeword detection with lower computational complexity than the prior schemes. Moreover, this can be achieved without sacrificing reliability. Overall, methods embodying the invention provide for reliable detection with reduced computational complexity, permitting efficient, practical implementation in MLC memory systems.

In general, the N symbols of each codeword can include modulation-coded user data or simply user data expressed in a $g^{ary}$ alphabet and not otherwise subject to encoding. The overall code includes the set of such codewords employed in operation of the system.

The predetermined reference signal levels for the q memory cell levels can be obtained in any desired manner. Preferred embodiments include determining the reference signal levels by processing the read signals for a group of B stored codewords. These reference signal levels can then be used in a self-adaptive process for detection of the B codewords in that group.

In preferred embodiments, the first correspondence criterion is dependent on predetermined statistical data for the distribution of read signal component levels corresponding to each of the memory cell levels. Such statistical data can include a statistical mean (or other form of average) signal level and a standard deviation for each distribution. The aforementioned reference signal levels can be determined from the level means here. In particularly preferred embodiments, the first correspondence criterion is based on a (simplified) maximum-likelihood criterion.

To simplify the component-based detection process, the memory cell levels corresponding to read signal components are preferably detected by comparing the components with a plurality of level thresholds indicative of boundaries between read signal component levels corresponding to different memory cell levels. The thresholds here can be appropriately determined according to said first correspondence criterion. Conveniently, the reliability indicator can then include the minimum of the differences between a read signal component and each of the level thresholds. Unreliable read signal components can be determined based on absolute or relative values of this indicator as discussed below.

The set of ordered codeword vectors for a read signal depends on the memory cell levels detected for the read signal components, including the most-closely corresponding levels and the next-most-closely corresponding levels for any unreliable components. Thus, one cell level is detected for each reliable component, and two possible cell levels are detected for each unreliable component. If there are u unreliable components, therefore, there are $2^u$ possible combinations of N memory cell levels corresponding to the N-component read signal. If the components of the read signal are first ordered according to signal level (i.e. in order of increasing signal level, or decreasing signal level), then the $2^u$ possible combinations of N (ordered) memory cell levels for the ordered read signal define $2^u$ ordered component vectors via the predefined correspondence between symbol values and cell levels. The symbol values in each ordered component vector thus correspond to one possible combination of the detected memory cell levels for the ordered read signal components. The set of candidate initial vectors for the ensuing codeword detection process depends on the resulting set of ordered component vectors. The details of the detection process depend on whether there is zero, one, or more than one candidate initial vector in this set as described further below.

An embodiment of a second aspect of the invention provides apparatus for detecting N-symbol codewords. An embodiment of a third aspect of the invention provides a data storage device.

In general, where features are described herein with reference to an embodiment of one aspect of the invention, corresponding features can be provided in embodiments of another aspect of the invention.

FIG. 1 is a simplified schematic of a solid-state storage device, a phase-change memory (PCM) device 1, embodying the present invention. The device 1 includes phase-change memory 2 for storing data in one or more integrated arrays of multilevel PCM cells. Each of the PCM cells in memory 2 can be set to one of q>2 nominal levels, designated $l_0$ to $l_{q-1}$ herein, by adjusting the resistance of the cell in known manner. Though shown as a single block in the figure, in general memory 2 can include any desired configuration of PCM storage units ranging, for example, from a single chip or die to a plurality of storage banks each containing multiple packages of storage chips. Write apparatus of device 1 includes an encoder 3 for encoding input user data as discussed below and a memory controller 4 which controls writing of the resulting codewords in memory 2. The device read apparatus also involves memory controller 4 for reading memory 2 to obtain read signals for stored codewords, and a decoder 5 for processing the read signals. Decoder 5 includes a codeword detector 6 which detects codewords corresponding to the received read signals, and a data decoder 7 which decodes the codewords to recover the original user data.

In operation of device 1, the input user data to be recorded in memory 2 is supplied to encoder 3. The encoder 3 encodes each input data word as a respective codeword which is output to memory controller 4. The codewords each have N q-ary symbols $s_n$, n=1, 2, . . . , N, where in general N≥q. Hence, the symbols of a codeword can each take one of q possible symbol values ($s_n \in \{0, 1, \ldots, q-1\}$). The encoding scheme is such that every codeword generated by encoder 3 is a permutation of one of a predefined plurality of N-symbol initial vectors whose symbols are ordered according to symbol value. Such an encoding scheme can be based on a union of permutation codes. A permutation code is characterized by a real vector of length N (the initial vector X0) on which the permutation group of N letters operates. The code is completely determined by its length N and the initial vector X0 which has N symbols arranged in order of increasing symbol value. The codewords include all length N vectors that are obtained through a permutation of the components of the initial vector. The set of valid codewords for the code employed in encoder 3 can include all, or a subset of, the codewords in a plurality of permutation codes. Such unions of permutation codes cover a broad class of codes including many codes of practical interest. Variant-1 permutation codes and single parity-check codes are notable examples, as indeed is uncoded transmission. In particular, $q^{ary}$ user datawords, which are not otherwise subjected to modulation coding, can be shown to be permutations of a smaller set of $q^{ary}$ vectors. In general, therefore, encoder 3 can perform modulation coding of input data or simple mapping of binary input data into $q^{ary}$ symbols without further encoding of the user data.

Codewords output by encoder 3 are written to memory 2 by memory controller 4. In a write operation, the N symbols of each codeword are stored in respective cells of memory 2. The q possible symbol values correspond to respective predetermined levels $l_0$ to $l_{q-1}$ of the q-level cells in memory 2. Each memory cell is thus set to a level dependent on the symbol value to be stored in accordance with the predefined correspondence between symbol values and cell levels. (Note that, when setting a cell to a given level, the actual resistance value x assumed by the cell can lie within a small interval around the nominal resistance value for the level due to write noise). To read a cell in a subsequent read operation, a small probing signal is applied to the cell to obtain a readback signal indicative of the cell's resistance.

Blocks of codewords are written/read substantially simultaneously in memory by memory controller 4. In this embodiment of the present invention, controller 4 writes/reads groups of B codewords in parallel so that the codewords in each group are written/read at the same time instants. In a read operation, the memory cells storing a group of B codewords are read to obtain B real-valued read signals y each having N signal components $y_n$, n=1, 2, . . . , N, indicating the read-back resistance values of the sequence of cells storing the N symbols of a codeword. The signal components $y_1, \ldots Y_N$ of each read signal thus correspond to respective symbols of a codeword. The read signals y are supplied to decoder module 5 where codeword detector 6 detects the codeword corresponding to each read signal by a process detailed below. Data decoder 7 then decodes the detected codewords by performing the inverse of the dataword-to-codeword mapping performed in encoder 3, thus recovering the original input data.

In general, functionality of encoder 3 and decoder 5 could be implemented in hardware, software or a combination thereof. For example, the mapping of input data words into codewords in encoder 3 can be implemented using a look-up table, in particular for small codes, or using the well-known technique of enumerative source coding for more efficient operation with large codes. Data decoder 7 can be implemented in corresponding manner to perform the inverse of the coding process. The codeword detector 6 includes control logic for implementing the various steps of the codeword detection process detailed below, and this control logic can be embodied in hardware or software or a combination of hardware and software components. Though the detection processes will be described in terms of a series of separate steps, functionality associated with different steps can be provided by a single component of the control logic, and a plurality of components can be involved in performance of any particular step. For example, one or more of the steps could be performed in whole or in part by software which configures a processor to implement the functionality described, and suitable software will be readily apparent to those skilled in the art. For reasons of operating speed, however, the use of hardwired logic circuits is generally preferred to implement detector functionality as far as possible. Again, suitable implementations will be readily apparent from the description of operation herein.

In read operations from memory 2, the read-back resistance levels corresponding to respective symbol values of the stored codewords are variable due to drift and noise effects. The readback resistance level distributions shift in time, with changing means and potentially variances, and are level-dependent, having data-dependent means and variances. Accurate detection of codewords from the codeword read signals y must account for this variation in the resistance level distributions. An overview of the codeword detection process in device 1 is given below with reference to the flow diagram of FIG. 2.

Figure 2:
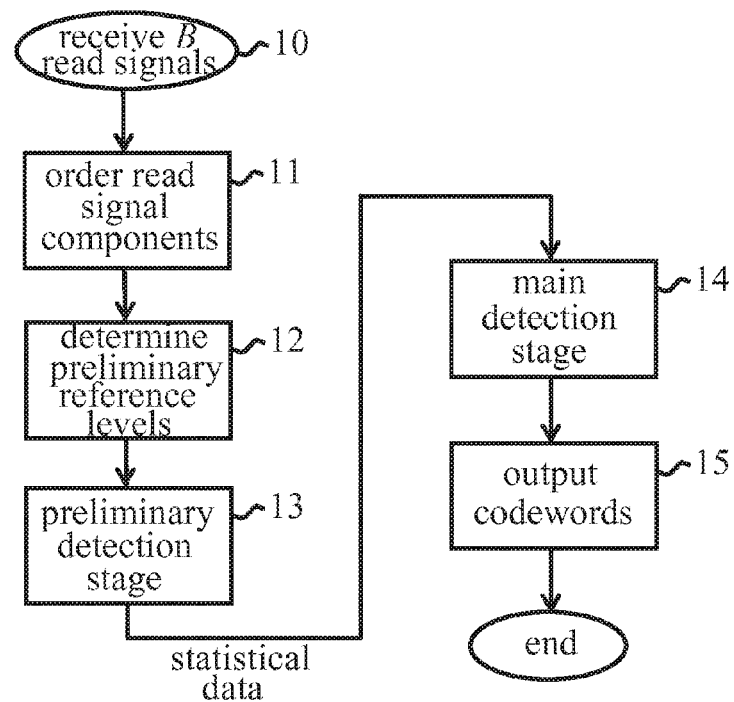
FIG. 2 indicates steps of a codeword detection process in the FIG. 1 device according to embodiments of the present invention.

FIG. 2 indicates the main operational steps performed by codeword detector 6. As indicated at step 10, operation commences on receipt of a group of B read signals y corresponding to a group of B codewords read from memory 2. The read signals y are temporarily stored in codeword detector 6 for use in the subsequent processing operation. In this example, the detection process begins with a sorting operation in which the control logic of detector 6 orders the components $y_1$ to $y_N$ of each read signal y according to signal level. In particular, in step 11 of FIG. 2, the read signal components are ordered in order of increasing signal level (reflecting the symbol order of the initial vectors here), to produce a group of B ordered read signals $z^b$:

$$z^b = [y_{k_1}^b, y_{k_2}^b, \ldots, y_{k_N}^b], y_{k_1}^b \leq y_{k_2}^b \leq \ldots \leq y_{k_N}^b, \text{ where}$$
$$b=1, \ldots, B$$

This ordering process defines a permutation ($k_1$ to $k_N$) of the signal components for each read signal y. The resulting ordered read signals, and their associated permutations, are stored in codeword detector 6 for use in later process steps. Next, in step 12, the detector logic processes the group of read signals to determine preliminary estimates for the reference signal levels corresponding to the q cell levels $l_0$ to $l_{q-1}$. These preliminary reference levels provide the starting point for a two-stage detection process. In step 13, the detector 6 performs a preliminary stage of the detection process. As detailed further below, this preliminary detection stage derives statistical data for the read signal level distributions for the q cell levels based on a component-based detection technique. The resulting statistical data, which includes revised estimates for the reference signal levels for the q cell levels, is then used in a main stage of the detection process represented by step 14 of FIG. 2. In this detection stage, as detailed below, codeword detector 6 uses the statistical data in a component-based detection technique to derive sets of candidate initial vectors for detection of individual codewords. The codeword detected for each of the B read signals is output by the codeword detector in step 15, and the detection process is complete.

The main detection stage of step 14 is described in more detail in the following. The basic steps of this process are explained first in relation to the flow diagram of FIG. 3, and each of these steps will then be discussed in more detail. In a first step, step 20, of the main detection process, the codeword detector 6 detects the memory cell level $l_m$ (m=0, 1, . . . q−1) which most-closely corresponds to each read signal component $y_n$, according to a first correspondence criterion. In step 21, the detector then calculates a reliability indicator for each component. This reliability indicator depends on proximity of the component to the reference signal level for the most-closely corresponding memory cell level $l_m$ identified in step 20 for that component. The reliability indicators are then used in step 22 to identify unreliable read signal components. In step 23, for each unreliable read signal component $y_n$, the detector logic additionally detects the next-most-closely corresponding memory cell level according to the aforementioned first correspondence criterion. In step 24, the results of the component-based detection performed in steps 20 and 23 are used by detector 6 to define a set of ordered codeword vectors for each read signal. In step 25, a set of candidate initial vectors is defined for each read signal by comparing the ordered codeword vectors to the set of initial vectors for the code. Finally, in step 26, the detector logic detects a codeword corresponding to each read signal. This detection step depends on the set of candidate initial vectors for the read signal, and in particular on whether there is zero, one or more than one candidate initial vector in this set.

Figure 3:
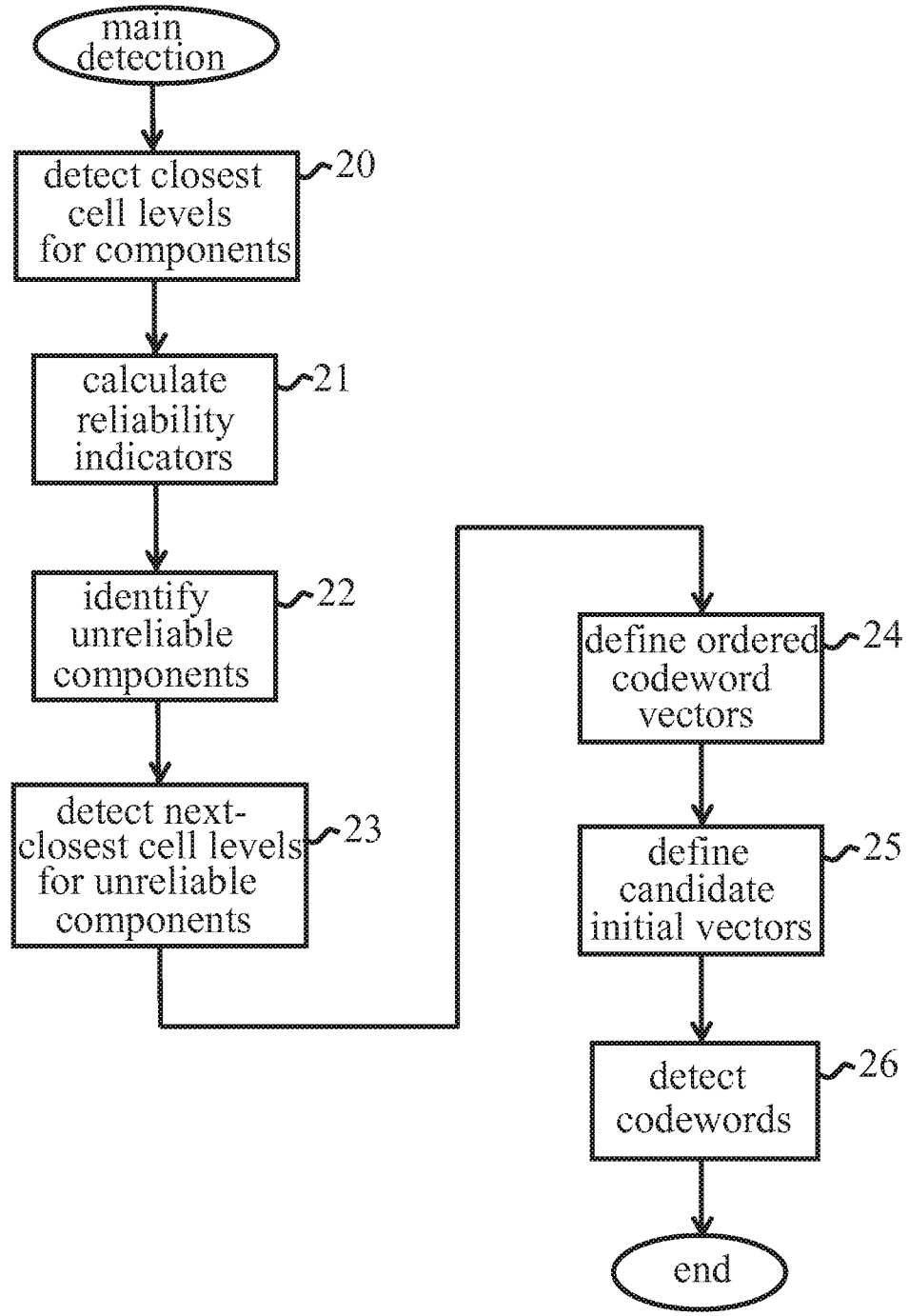
FIG. 3 indicates steps of a main detection stage of the FIG. 2 process according to embodiments of the present invention.

The first correspondence criterion used in step 20 of FIG. 3 depends on reference signal levels for the q cell levels. In the present embodiment, these reference signal levels are provided by the statistical data output from the preliminary detection stage (step 13 of FIG. 2). In particular, the statistical data includes, for each cell level $l_m$ (m=0, 1, . . . q−1), a statistical average (here mean) level $\lambda_m$ calculated as described below from the distribution of read signal component levels corresponding to that memory cell level. These mean levels $\lambda_0$ to $\lambda_{q-1}$ provide the reference signal levels for the corresponding cell levels $l_0$ to $l_{q-1}$. The statistical data from the preliminary detection stage also includes a standard deviation, denoted by $\sigma_0$ to $\sigma_{q-1}$, obtained from the read signal level distribution for each memory cell level. The first correspondence criterion used in step 20 of FIG. 3 comprises a simplified maximum-likelihood (ML) criterion which uses the statistical data $\lambda_m$, $\sigma_m$ for the cell levels. In particular, if the components of the ordered read signals $z^b$ are given by:

$$z^b = [z_{b,1}, z_{b,2}, z_{b,3}, \ldots z_{b,N}] \text{ for } b=1 \text{ to } B,$$

then the ML criterion for determining the most-closely corresponding cell level $l_m$ for a read signal component $z_{b,n}$ (n=1 to N) is given by:

$$\arg_m \max(1/(\sqrt{(2\pi)}\sigma_m) \exp(-(z_{b,n}-\lambda_m)^2/(2\sigma_m^2)))$$

where "exp" denotes exponent, and "$\arg_m \max(F)$" denotes the value of m which maximizes the function F. This criterion is simplified in the present embodiment by defining a plurality of level thresholds indicative of boundaries between read signal component levels corresponding to different memory cell levels. In particular, if the level thresholds are denoted by $h_j$ for j=0, 1, . . . , q−2, then according to the simplified ML criterion the level thresholds are defined by:

$$h_j = (\tfrac{1}{2}) * [\lambda_j + \lambda_{j+1} + L*(\sigma_j - \nu_{j+1})]$$

where "*" denotes multiplication here, and L is a predetermined constant which can be selected as desired. In this particular example, L=3.

Figures 4A, 4B:
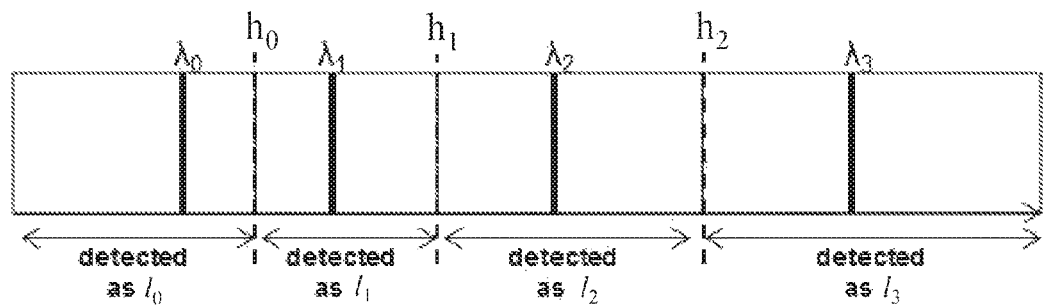
FIGS. 4a and 4b illustrate use of thresholds for component-based level detection in the FIG. 3 process according to embodiments of the present invention.

Based on the simplified ML criterion, the memory cell level $l_m$ which most-closely corresponds to each read signal component $z_{b,n}$ is detected in step 20 by comparing the component with the level thresholds $h_j$. This process can be understood from FIGS. 4a and 4b. FIG. 4a is a schematic illustration of the reference signal levels (level means) $\lambda_m$ and level thresholds $h_j$ for an exemplary system with q=4 cell levels $l_0$ to $l_3$. The ranges of read signal component levels demarcated by these thresholds will be detected as most-closely corresponding to the cell levels indicated beneath the respective ranges in FIG. 4a. This can be achieved by simple comparison of each component $z_{b,n}$ with each threshold $h_j$, with the appropriate level $l_m$ being determined according to the table of FIG. 4b.

The reliability indicator is calculated in step 21 of FIG. 3 as follows. For each read single component $z_{b,n}$, the reliability indicator $r_{b,n}$ includes the minimum of the differences between a read signal component and each of the level thresholds:

$$r_{b,n} = \min(z_{b,n} - h_j), j=0,1,\ldots q-2,$$

By measuring proximity of the component to the closest threshold, the reliability indicator thus depends on proximity of the component to the reference signal level $\lambda_m$ for its most-closely corresponding memory cell level $l_m$ detected in step 20. The smaller $r_{b,n}$, the further the component $z_{b,n}$ is from the mean level $\lambda_m$, indicating lower reliability.

Unreliable components are identified as follows in step 22 of FIG. 3. For each ordered read signal $z^b$, the u least reliable components $z_{b,n}$ are selected as unreliable where 2≤u≤N. In this preferred embodiment u=2. Hence, the two read signal components $z_{b,n}$ with the smallest reliability indicators $r_{b,n}$ are marked as unreliable in this example. For each of these unreliable components, the next-most-closely corresponding memory cell level $l_m$ is additionally detected, in step 23, according to the simplified ML criterion of step 20. This "next-closest" level is the other of the two memory cell levels (the first being the "closest" level already detected in step 20) whose component ranges (see FIG. 4a), and hence level means $\lambda_m$, are adjacent the closest threshold $h_j$ to the component.

The cell levels detected for components of an ordered read signal in steps 20 and 23 of FIG. 3 are used in step 24 to define the set of ordered codeword vectors for that read signal. As just described, only the closest cell level is detected for each reliable component, whereas two cell levels (the closest and next-closest) are detected for each unreliable component. Thus, there are $2^2=4$ possible combinations of N memory cell levels corresponding to the N components of each ordered read signal.

Each of these four combinations of N memory cell levels defines an ordered component vector via the predefined correspondence between symbol values and cell levels. Thus, each ordered codeword vector has N symbols, corresponding to respective components of the read signal ordered according to signal level, where the symbol values in each ordered component vector correspond to a respective one of the four possible combinations of detected memory cell levels for the ordered read signal components.

The sets of candidate initial vectors are determined in step 25 as follows. For each ordered read signal $z^b$, the set of candidate initial vectors is obtained as the intersection of the set of ordered codeword vectors derived in step 24 for that read signal and the known set of initial vectors for the code employed in encoder 3. The ordered codeword vectors from step 24 are thus matched to the set of initial vectors to obtain a reduced set of candidate initial vectors for the read signal.

The codeword detection process in step 26 of FIG. 3 depends on the number of vectors in the set of candidate initial vectors for a particular read signal. If there is only one candidate initial vector in the set, the codeword for the read signal is detected by applying an inverse permutation to that candidate initial vector. This inverse permutation is simply the inverse of the permutation ($k_1$ to $k_N$) of the read signal y performed in step 11 of FIG. 2 which produced the ordered read signal $z^b$.

If the set of candidate initial vectors for an ordered read signal contains more than one initial vector, the codeword corresponding to that read signal is detected by selecting from the set of candidate initial vectors the initial vector which most-closely corresponds to the ordered read signal according to a second correspondence criterion. The second correspondence criterion used here is thus a vector criterion whereby each candidate initial vector is compared with the ordered read signal. In this preferred embodiment, the second correspondence criterion is again based on a simplified ML criterion obtained as follows.

If there are P initial vectors $V_p$, p=1 to P, then the vector ML metric $M_p$ can be expressed as:

$$M_p = \log(\Pi_{n=1}^N \sigma_{p,n}) + \Sigma_{n=1}^N ((z_{b,n} - \mu_{p,n})^2/(2\sigma_{p,n}^2)))$$

where $\mu_{p,n}$ and $\sigma_{p,n}$ are the statistics (mean and standard deviation respectively) of component n of initial vector $V_p$ based on level mapping for cell levels $l_0$ to $l_{q-1}$. This criterion is simplified in the present embodiment as follows. We assume initially that there are two candidate initial vectors $V_{p1}$ and $V_{p2}$ and that the code has distance 2 so that the two vectors differ in two positions only. Let n1 and n2 denote these two positions. A simplified vector ML metric can be expressed by:

$$M_{p1} = (z_{b,n1} - \mu_{p1,n1})^2/\sigma^2_{p1,n1} + (z_{b,n2} - \mu_{p1,n2})^2/\sigma^2_{p1,n2}$$

$$M_{p2} = (z_{b,n1} - \mu_{p2,n1})^2/\sigma^2_{p2,n1} + (z_{b,n2} - \mu_{p2,n2})^2/\sigma^2_{p2,n2}$$

The initial vector $V_{p1}$, $V_{p2}$ which gives the minimum metric $M_{p1}$, $M_{p2}$ is selected for the read signal. The codeword for that read signal is detected by applying an inverse permutation to the selected vector $V_{p1}$ or $V_{p2}$. Again, this inverse permutation is the inverse of the permutation ($k_1$ to $k_N$) of the read signal y performed in step 11 of FIG. 2.

Note that the simplified vector ML criterion above can be applied to more than two candidate initial vectors $V_{p1}$ to $V_{px}$ by comparing the simplified metrics $M_{p1}$ to $M_{px}$ in pairs and selecting the overall minimum. The process can also be adapted in a straightforward manner to codes with distance other than 2 as will be readily apparent to those skilled in the art.

The simplified vector ML criterion only operates over the reduced set of initial vectors and does not need to consider all initial vectors for the code. Moreover, this criterion is only required for the small number of read signals with more than one candidate initial vector. By way of illustration, a simulation performed for a q=4, N=8 code with distance 2 gave the following probabilities (Prob) for the number P* of vectors in the set of candidate initial vectors for read signals: Prob(P*=0)=0.0002; Prob(P*=2)=0.0114; Prob(P*=3)=0.0002; Prob(P*>3)>>0.0002; Prob(P*=1)=1−rob(P*=0)−Prob(P*=2)−Prob(P*>=3)

In some cases, the set of candidate initial vectors for an ordered read signal can be the zero set, i.e. contain no initial vectors. In this event, the codeword corresponding to that read signal could be detected, in general, in any desired manner. In this preferred embodiment, however, the codeword is detected by selecting from the set of initial vectors an initial vector with the smallest Hamming distance to an ordered codeword vector as defined in step 24 for that read signal. If there is more than one ordered codeword vector, then the vector corresponding to the N closest cell levels detected for the ordered read signal components can be used here. Again, an inverse permutation is then applied to the selected initial vector, this being the inverse of the permutation which produced the ordered read signal.

Referring back to FIG. 2, the preliminary detection stage of step 13 will now be described in more detail. This stage uses the preliminary reference levels from step 12 to derive the statistical data, including reference levels $\lambda_0$ to $\lambda_{q-1}$, used in the main detection stage just described. For each of the B ordered read signals generated in step 11, the detector 6 detects the memory cell level which most-closely corresponds to each read signal component according to a third correspondence criterion. The third correspondence criterion is dependent on the preliminary reference levels, denoted here by $\lambda'_0$ to $\lambda'_{q-1}$, from step 12. In this example, the third correspondence criterion is based on a simplified minimum distance (MD) criterion as follows. For a component $z_{b,n}$ (n=1 to N) of an ordered read signal, the MD criterion for determining the most-closely corresponding cell level can be expressed as:

$$\arg_m \min(D(z_{b,n}, \lambda'_m)) = \arg_m \min(z_{b,n} - \lambda'_m)$$

where "$\arg_m \min(F)$" denotes the value of m which minimizes the function F. As before, this criterion is simplified here by defining a plurality of level thresholds indicative of boundaries between read signal component levels corresponding to the different memory cell levels. These level thresholds $h_j$ (j=0, 1, ... q−2) are calculated here to be equally spaced between adjacent preliminary reference levels $\lambda'_0$ to $\lambda'_{q-1}$. The closest cell level to each read signal component $z_{b,n}$ is then detected as in step 20 of FIG. 3 by comparing the component with the level thresholds $h_j$.

Based on the foregoing component-based detection step, read signal level distributions can be defined for each of the nominal cell levels $l_0$ to $l_{q-1}$. The distribution for each cell level can be based on all, or only a subset of, the read signal component levels detected as corresponding to that memory cell level according to the third correspondence criterion above. In some embodiments, for example, unreliable components could be detected based on a reliability indicator as described earlier. These unreliable components could be excluded from the distributions which would then contain only the subset of reliable components. For simplicity, however, in this preferred embodiment of the present invention, all components are included in the level distributions. The detector 6 then calculates statistical data for the level distributions. In particular, a statistical average level is calculated for each distribution. In this preferred embodiment the average here is a simple statistical mean, though other forms of average, such as a median or a weighted average, might be envisaged. The statistical mean provides the reference signal level $\lambda_m$ for the corresponding cell level $l_m$. The standard deviation $\sigma_m$ is also calculated for each level distribution, and the resulting statistical data $\lambda_m$, $\sigma_m$ for the q cell levels is output to the main detection stage described above.

Determination of the preliminary reference levels $\lambda'_0$ to $\lambda'_{q-1}$ in step 12 of FIG. 2 will now be described in more detail. This step is based on a modification of the reference level estimation technique described in our above-referenced UK Application no. 1203496.3. This level estimation process will be explained with reference to FIG. 5 for an exemplary system with q=4 cell levels $l_0$ to $l_3$.

Figure 5:
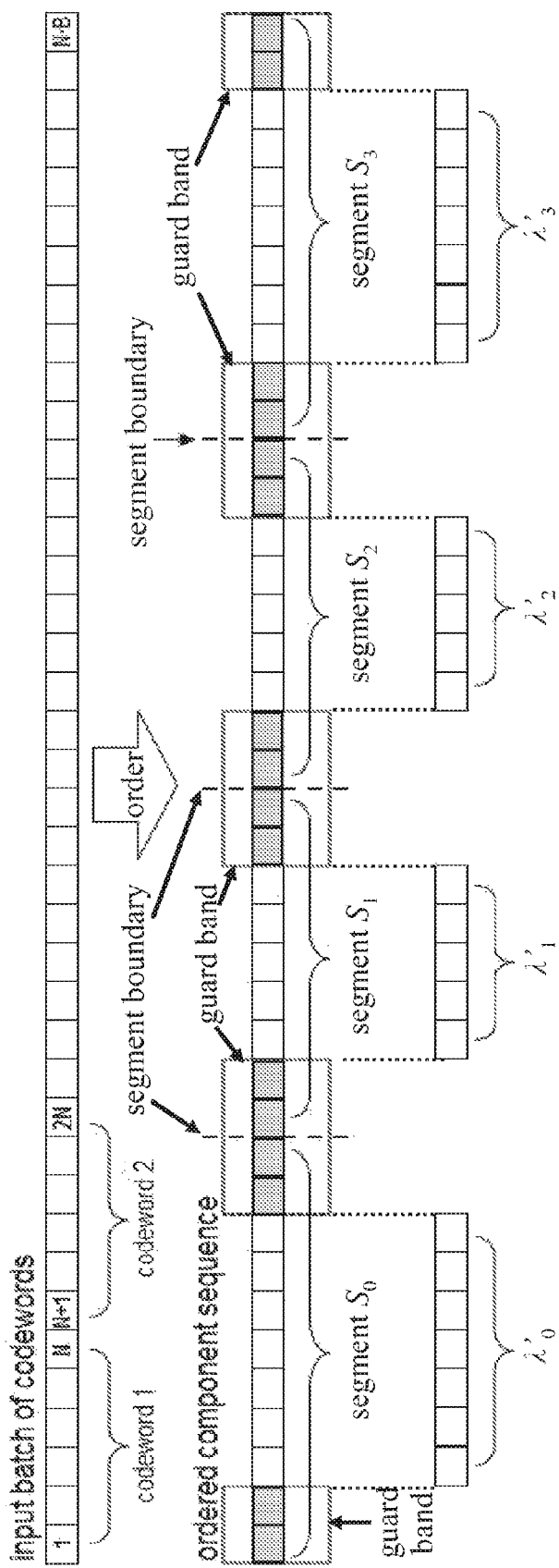
FIG. 5 illustrates features of a preliminary reference level determination step in the FIG. 2 process according to embodiments of the present invention.

The level estimation process begins with the batch of 8 read signals $y^{(B)}$ which form a concatenated $y^B=[y^{(1)}, y^{(2)}, \ldots, y^{(B)}]$, having B×N read signal components, as illustrated at the top of FIG. 5. The control logic of detector 6 then orders the B×N components of the concatenated word $y^B$ according to signal level. In particular, the read signal components are ordered in order of increasing signal level to produce an ordered component sequence $y^s=[y_1^s, y_2^s, \ldots y_{BN}^s]$ as indicated in the figure. Next, the detector logic partitions the ordered component sequence $y^s$ into q consecutive segments $S_m$, m=0 to q-1, each corresponding to a respective one of the q memory cell levels. The number of components in each segment $S_m$ depends on predetermined frequency data indicative of expected frequency of occurrence of the corresponding memory cell level in use of the code. This is explained in more detail below. Next, guard bands are defined at the boundaries of the segments. The guard band at a segment boundary contains one or more components of each segment adjacent the boundary. The numbers of components in each guard band can be predefined for all segments or can differ for different segments, e.g. depending on a percentage of the segment size. In any case, the components within guard bands (represented by the shaded sections in the schematic representation of FIG. 5) are marked as unreliable. The detector logic then determines the preliminary reference signal level $\lambda'_m$ for each of the q memory cell levels $l_m$ in dependence on the signal components in the middle section of the corresponding segment, i.e. excluding unreliable components in the guard bands. This process will be described further below.

As indicated above, the size of the segments into which the ordered component sequence is partitioned depends on expected frequency of occurrence of the q memory cell levels in use of the code. Appropriate frequency data, indicative of the expected level frequencies, can be defined for any given code based on the structure of the code $C \subseteq \{0, 1, \ldots, q-1\}^N$ and how likely each codeword is to appear (e.g. expressed in terms of codeword probabilities) in use of the code. In some systems, for example, all codewords can be equally likely. In others, some codewords can occur more frequently than others. In any case, given defined codeword probabilities and the known code structure, the expected frequency of occurrence of a given level can be calculated. In this example, assuming that the stored codeword signals written and read at time $t_0$ have components $[x_1, \ldots, x_N]$, the frequency data is calculated as the average frequency $f_m$ of each nominal cell level $l_m$ via:

$$f_m = E[\Sigma_{n=1,\ldots,N}\delta(X_n, l_m)] m=0,2\ldots,q-1$$

where: the expectation function E[.] is with respect to the codeword probability distribution;

$X_n$ is a random variable representing a stored codeword component $x_1$ to $x_N$; and $\delta$ represents the Kronecker delta such that $\delta=1$ is $X_n=l_m$ and $\delta=0$ otherwise.

The frequency data $f_m$ for each level $l_m$ thus indicates the expected average value (over all codewords and accounting for the codeword probabilities) for the number of occurrences of that level in a stored codeword signal at time $t_0$.

For a batch of B randomly selected codewords $x^{(b)}$, b=1, \ldots, B, assume that the components of the concatenated word $x^B=[x^{(1)}, x^{(2)}, \ldots, x^{(B)}]$ are ordered according to increasing signal level to obtain the ordered component sequence $x^s$ of length B×N. This range 1, 2, \ldots, B×N can then be partitioned into q consecutive segments $S_m$ of size about $f_m B$ (i.e. the segment size is as close as possible to $f_m B$ subject to rounding to integer values). If the components $x^s$ are then averaged over each segment $S_m$, one obtains an approximation of the q corresponding levels $l_m$.

In the read-detection process of FIG. 2, the original nominal levels have drifted over time. By assumption, however, drift maintains the ordering of the levels and so the drifted levels can be estimated from a batch of B readback codewords $y^{(b)}$, b=1, \ldots, B, following the procedure given above for the corresponding codewords $x^{(b)}$ before drift. Hence, in step 12 of FIG. 2, the ordered component sequence $y^s=[y_1^s, y_2^s, \ldots y_{BN}^s]$ is partitioned into q consecutive segments $S_m$ of size $f_m B$ (subject to rounding to integer values). In step 13 of FIG. 2, the drifted levels $\lambda'_0$, $\lambda'_1, \ldots, \lambda'_{q-1}$ are estimated by averaging the signal components in the middle section $M_m$ (i.e. excluding unreliable components in the guard bands) of the corresponding segment $S_m$:

$$\lambda'_m = (1/|M_m|)\Sigma_{n \in M_m} y_n^s.$$

The resulting drifted levels thus provide the preliminary reference levels which are used in the preliminary detection stage described above.

It will be seen that the above codeword detection system relies primarily on simple, component-based detection whereby cell levels corresponding to read signal components are detected on a component-by-component basis. The reliability indicators in the main detection stage are then used in conjunction with this component-based detection to define a reduced set of candidate initial vectors for codeword detection. The simplified vector-based detection in step 26 of FIG. 3 is required only if there are multiple candidate initial vectors, and then operates only over the reduced set of candidate vectors as opposed to the entire initial vector set for the code. In this way, computational complexity is very significantly reduced compared to the previous systems discussed above. For practical, high rate codes in particular, where the number of initial vectors is high, complexity is dramatically reduced. Despite this, the above system achieves reliable initial vector detection. Performance is substantially identical to that of the detection system described in in our UK Application no. 1203496.3, and also significantly better than other, conventional methods. By way of illustration, the table of FIG. 6 compares the total number of arithmetic operations for the system of our aforementioned UK application (indicated as "Method A") and the system detailed above (indicated as "Method B"). For Method A the table shows the number of arithmetic operations in: a preliminary detection stage of vector-based minimum difference (MD) detection; calculation of statistical data (level means λ and variance ($\sigma^2$) estimation); and a main detection stage of vector-based maximum likelihood (ML) detection. For Method B the table shows the number of arithmetic operations in: the preliminary detection stage of component-based ("scalar") minimum difference (MD) detection using the thresholds described above; calculation of the statistical data (level means λ and variance ($\sigma^2$) estimation); and the main detection stage of component-based maximum likelihood (ML) detection using the reliability information as detailed above. The number of additions (ADD), multiplications (MUL), divisions (DIV), logarithms (LOG), square root (SQRT) and comparisons (COMP) are shown in each case. The number of adders, multipliers/comparators and latency of each method depends strongly on implementation details such as architecture, input data interface and code rate. The numbers shown reflect use of a q4N8 code with: q=4 levels; codeword length N=8; P=85 initial vectors; batch size B=32; u=2 unreliable components in step 22 of FIG. 3; and considering Prob(P*=2)=1/B, Prob(P*>2)=0 (i.e. excessively over-estimated as a worst case scenario). The dramatic savings are indicated at the bottom of the table.

Figure 7:
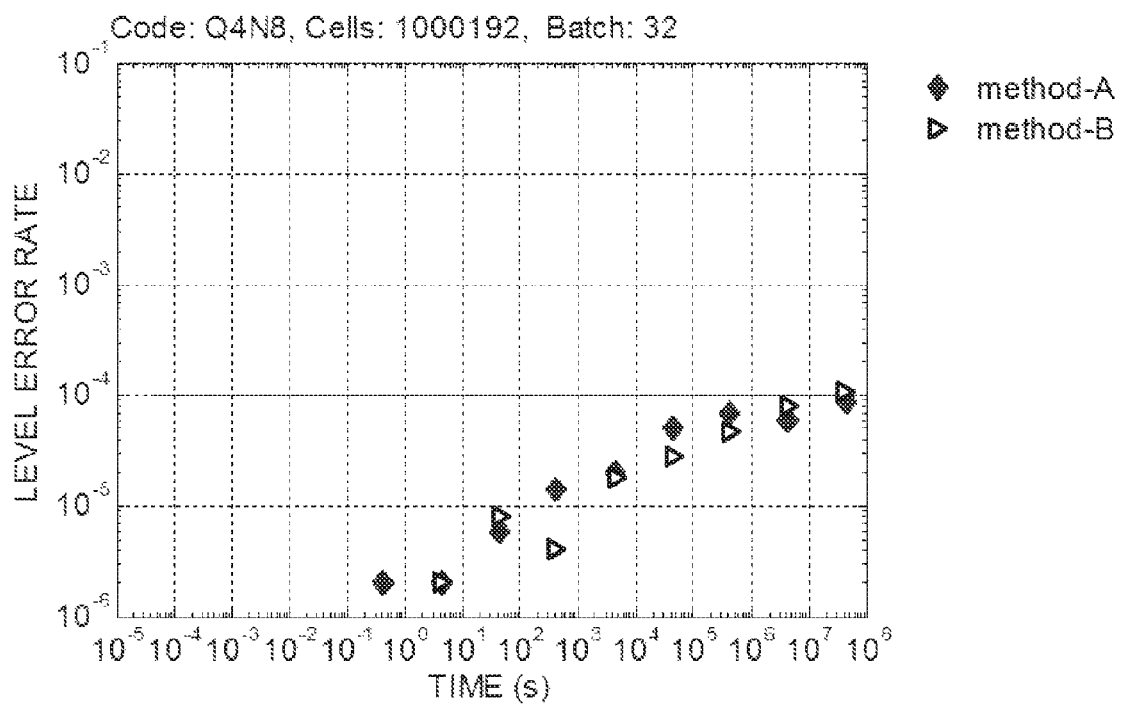
FIG. 7 compares performance of the FIG. 2 detection process with the previously-proposed technique according to an embodiment of the present invention.
Figure 8:
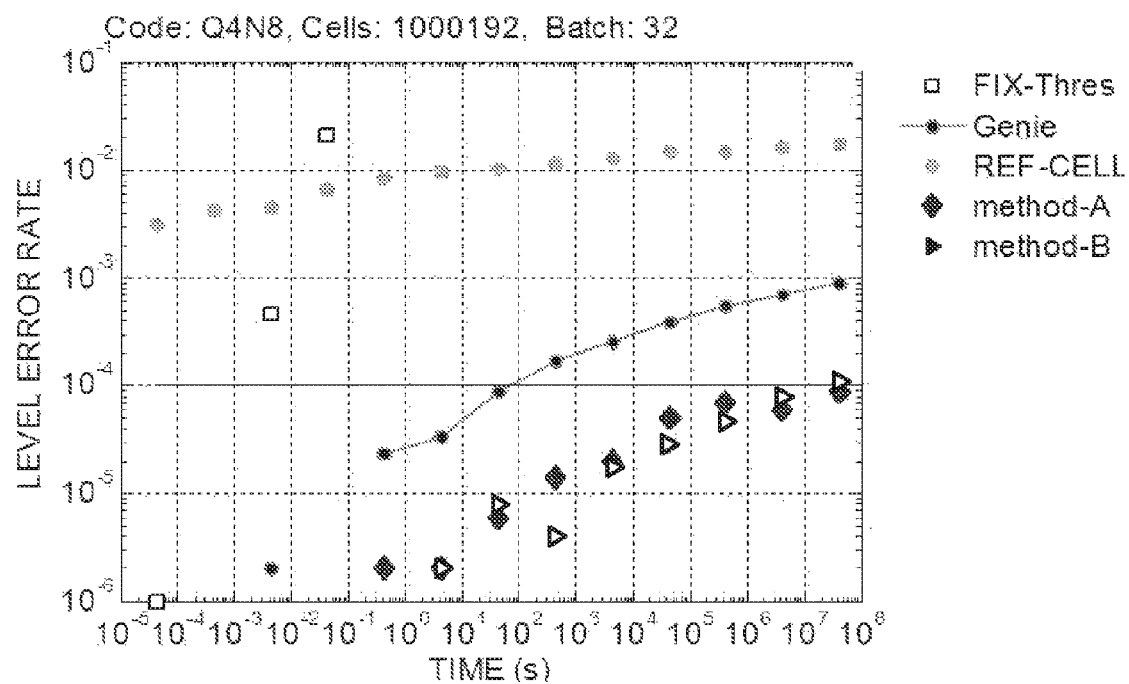
FIG. 8 illustrates performance of the FIG. 2 process in relation to other detection systems according to embodiments of the present invention.

FIG. 7 compares performance of the two methods in terms of level error rate as a function of time for the same code based on reading batches of B=32 codewords from 1000192 cells. The performance is shown to be substantially identical. FIG. 8 additionally indicates performance of three further detection systems. The "REF-CELL" trace represents a conventional technique based on reading of reference cells, storing known information, to estimate the level means and standard deviations at all times. The "Genie" trace indicates results using a genie (i.e. assuming perfect knowledge of the means/standard deviations of the level distributions at all times) for the level estimation, followed by component-based ML detection. The "FIX-Thres" trace indicates results using fixed (non-adaptive) reference levels for level detection. The superior performance of the above system is readily apparent from this figure.

It will of course be appreciated that many changes and modifications can be made to the particular embodiments detailed above. For example, other criteria could be employed for the various correspondence criteria above, and a given criterion could additionally depend on other factors than those specified in the above examples. The first correspondence criterion, for instance, could alternatively be based on a MAP (maximum a posteriori) criterion. Other proximity-dependent functions might also be used for the reliability indicator, and identification of unreliable components in step 22 of FIG. 3 could be performed in other ways. For instance, unreliable components could be identified by comparing the reliability indicator with a predetermined reliability threshold. This can be, for example, a global threshold applied for all levels or a level-dependent threshold (e.g. α% of $\lambda_m - \lambda_{m-1}$).

In general, the reference signal levels used for the main detection stage could be determined in a variety of ways. For example, the level statistics could be determined directly from the segments of the ordered component sequence generated in step 12 of FIG. 2. In other embodiments, the preliminary reference levels could be predefined for the detection process or determined in any desired manner. For example, step 12 could employ a reference level estimation technique as described in our above-referenced patent applications. Another example of a reference level estimation technique which could be employed here is described in our copending UK patent application no. 1301623.3, filed 30 Jan. 2013.

In the component-based detection steps, the cell level corresponding to each read signal component might in general be detected directly or indirectly, and can be explicitly identified in terms of cell level per se (as above) or implicitly defined in terms of the corresponding reference signal level or symbol value for a cell level. The ordered codeword vectors and candidate initial vectors might similarly be defined directly or indirectly, in terms of symbols per se or their corresponding memory cell levels or reference signal levels.

Some steps can be performed in a different order to that described above. For example, the ordering process in step 11 of FIG. 2 can be performed later in the process or can be performed as part of the preliminary reference level determination in step 12 in some embodiments.

While memory 2 uses PCM cells in this example, the techniques described are generic and can be applied to any other multilevel memory cells, e.g. flash memory cells, for level estimation.

What is claimed is:

1. A data storage device, comprising:
   a memory having q-level memory cells, where q>2;
   a write apparatus for writing in the memory N-symbol codewords, each N-symbol codeword being a permutation of one of a predefined plurality of N-symbol initial vectors having symbols that are ordered according to a symbol value, wherein the symbols of each codeword have one of q symbol values and are stored in respective memory cells; and
   an apparatus for detecting the N-symbol codewords on reading of the memory, the apparatus comprising:
      a memory controller for reading the memory cells storing each codeword to obtain a read signal having N signal components corresponding to respective symbols of the codeword; and
      a codeword detector including control logic adapted to perform the steps of a method comprising:
         detecting the memory cell level which most-closely corresponds to each read signal component according to a first correspondence criterion dependent on reference signal levels for the q cell levels;
         identifying unreliable read signal components dependent on a reliability indicator for each read signal component, wherein the reliability indicator is dependent on proximity of the read signal component to the reference signal level for the most-closely corresponding memory cell level;
         additionally detecting, for each unreliable read signal component, the next-most-closely corresponding memory cell level according to the first correspondence criterion;
         defining, for each read signal, a set of ordered codeword vectors each having N symbols corresponding to respective components of the read signal ordered according to a signal level, wherein the symbol values in each ordered codeword vector correspond to one possible combination of the detected memory cell levels for the read signal components;
         defining, for each read signal, a set of candidate initial vectors having intersection of the set of ordered codeword vectors for that read signal and the predefined plurality of N-symbol initial vectors; and
         detecting, if the set of candidate initial vectors for the read signal contains at least one vector, the codeword corresponding to that read signal that is dependent on the set of candidate initial vectors.

2. The data storage device according to claim 1, wherein the first correspondence criterion is dependent on predetermined statistical data for a distribution of read signal component levels corresponding to each of the memory cell levels.

3. The data storage device according to claim 2, wherein the first correspondence criterion is based on a maximum-likelihood criterion.

4. The data storage device according to claim 1, wherein the memory cell levels corresponding to read signal components are detected by comparing the read signal components with a plurality of level thresholds indicative of boundaries between read signal component levels corresponding to different memory cell levels.

5. The data storage device according to claim 4, wherein the reliability indicator includes the minimum of the differences between a read signal component and each of the plurality of level thresholds.

6. The data storage device according to claim 1, wherein for each read signal, identifying u read signal components as unreliable read signal components where $2 \leq u \leq N$.

7. The data storage device according to claim 6, wherein $u=2$.

8. The data storage device according to claim 1, wherein the method steps further comprise:
identifying a read signal component as an unreliable read signal component by comparing the reliability indicator for that read signal component with a predetermined reliability threshold.

9. The data storage device according to claim 1, wherein, if the set of candidate initial vectors for a read signal contains only one initial vector, the codeword corresponding to that read signal is detected by applying an inverse permutation to that initial vector, and wherein the inverse permutation is the inverse of the permutation of the read signal which orders the read signal components according to the signal level.

10. The data storage device according to claim 1, wherein, if the set of candidate initial vectors for a read signal contains more than one initial vector, the codeword corresponding to that read signal is detected by a method comprising:
selecting from the set of candidate initial vectors the initial vector which most-closely corresponds to an ordered read signal which is obtained by ordering the read signal components according to the signal level, according to a second correspondence criterion; and
applying an inverse permutation to the selected initial vector, the inverse permutation being the inverse of the permutation of the read signal producing the ordered read signal.

11. The data storage device according to claim 10, wherein the second correspondence criterion is based on a maximum-likelihood criterion.

12. The data storage device according to claim 1, wherein, if the set of candidate initial vectors for a read signal contains no initial vectors, the codeword corresponding to that read signal is detected by the codeword detector implementing method steps that further comprise:
selecting from the predefined plurality of N-symbol initial vectors the initial vector which has a smallest Hamming distance to an ordered codeword vector for that read signal; and
applying an inverse permutation to that initial vector, wherein the inverse permutation is the inverse of the permutation of the read signal which orders the read signal components according to the signal level.

13. The data storage device according to claim 1, wherein by the codeword detector implements method steps that further comprise:
determining the reference signal levels by processing the read signals for a group of B stored codewords.

14. The data storage device according to claim 13, wherein the reference signal levels are determined via a preliminary detection stage, the codeword detector implements method steps that further comprise:
detecting, for B read signals, the memory cell level which most-closely corresponds to each read signal component according to a third correspondence criterion dependent on preliminary reference levels for the q cell levels; and
calculating a statistical average level for the distribution of at least a subset of the read signal component levels corresponding to each memory cell level according to the third correspondence criterion;
wherein the reference signal level for a memory cell level includes the statistical average level for that memory cell level.

15. The data storage device according claim 14, wherein the third correspondence criterion is based on a minimum-distance criterion.

16. The data storage device according to claim 14, wherein the memory cell levels corresponding to the read signal components according to the third correspondence criterion are detected by comparing the read signal components with a plurality of preliminary thresholds that are indicative of boundaries between the read signal component levels corresponding to the different memory cell levels.

17. The data storage device according to claim 14, wherein determining the preliminary reference levels for the group of B codewords comprises:
ordering the read signal components of the group of B read signals according to the signal level to produce an ordered component sequence;
partitioning the ordered component sequence to obtain segments corresponding to respective memory cell levels, each segment containing a number of components dependent on predetermined frequency data indicative of expected frequency of occurrence of the corresponding memory cell level; and
determining the preliminary reference level for each of the q memory cell levels in dependence on the read signal components in a middle section of the corresponding segment, wherein the middle section excludes at least one component adjacent each boundary of the segment.

* * * * *